United States Patent [19]

Lockwood

[11] 3,785,884

[45] Jan. 15, 1974

[54] METHOD FOR DEPOSITING A SEMICONDUCTOR MATERIAL ON THE SUBSTRATE FROM THE LIQUID PHASE

[75] Inventor: Harry Francis Lockwood, New York, N.Y.

[73] Assignee: RCA Corporation, New York, N.Y.

[22] Filed: July 21, 1972

[21] Appl. No.: 273,752

[52] U.S. Cl. .................. 148/171, 148/172, 118/415, 117/201

[51] Int. Cl. ............................................... H01l 7/38

[58] Field of Search ............................ 148/171, 172; 118/415; 117/201

[56] References Cited

UNITED STATES PATENTS

| | | | |
|---|---|---|---|
| 3,665,888 | 5/1972 | Bergh et al. | 148/171 X |
| 3,631,836 | 1/1972 | Jarvela et al. | 148/171 X |
| 3,713,900 | 1/1973 | Suzuki | 148/1.5 |

*Primary Examiner*—G. T. Ozaki
*Attorney*—Glenn H. Bruestle et al.

[57] ABSTRACT

A layer of a semiconductor material is epitaxially deposited on a substrate by liquid phase epitaxy wherein a heated solution of the semiconductor material dissolved in a molten solvent is brought into contact with a surface of the substrate and the solution and substrate are cooled to deposit the semiconductor material on the substrate. During the cooling of the solution and the substrate heat is radiated from the substrate faster than from the solution so that the substrate is at a temperature slightly below the temperature of the solution. The heat radiation differential can be achieved by carrying out the method in a container having a heat radiation window therethrough over which the substrate is mounted.

1 Claim, 2 Drawing Figures

METHOD FOR DEPOSITING A SEMICONDUCTOR MATERIAL ON THE SUBSTRATE FROM THE LIQUID PHASE

BACKGROUND OF THE INVENTION

The invention herein disclosed was made in the course of or under a contract or subcontract thereunder with the Department of the Air Force.

The present invention relates to a method and apparatus for depositing an epitaxial layer of a semiconductor material on a substrate by the liquid phase deposition technique, and more particularly to a method and apparatus for achieving a growth of the epitaxial layer which is of good planarity.

A technique which has come into use for making certain types of semiconductor devices particularly semiconductor devices made of the group III–V semiconductor materials and their alloys, such as light emitting devices and transferred electron devices is known as "liquid phase epitaxy." Liquid phase epitaxy is a method for depositing an epitaxial layer of a single crystalline semiconductor material on a substrate wherein a surface of the substrate is brought into contact with a solution of a semiconductive material dissolved in a molten metal solvent, the solution is cooled so that a portion of the semiconductor material in the solution precipitates and deposits on the substrate as an epitaxial layer, and the remainder of the solution is removed from the substrate. The solution may also contain a conductivity modifier which deposits with the semiconductor material to provide an epitaxial layer of a desired conductivity type. Two or more epitaxial layers can be deposited one on top of the other to form a semiconductor device of a desired construction including a semiconductor device having a PN junction between adjacent epitaxial layers of opposite conductivity type.

A problem which arises in the liquid phase epitaxy process is to obtain a stable growth of the epitaxial layer so as to achieve good planarity of the epitaxial layers, particularly at the interface with the substrate on which the epitaxial layer is grown. Good planarity is of particular importance when the interface is a PN junction of a semiconductor device. The stability of the growing epitaxial layer in the liquid phase epitaxy process depends to a large extent on how heat is removed from the solution and substrate as the temperature is reduced to precipitate the semiconductor material from the solution and deposit the semiconductor material on the substrate. If in the cooling process the solution cools faster than the surface of the substrate, the growth will tend to be dendritic and therefore nonplanar. Therefore, it is desirable to have a method and apparatus for depositing the layer of the semiconductor material by liquid phase epitaxy in which dentritic growth is prevented so as to achieve good planarity.

SUMMARY OF THE INVENTION

A semiconductor material is epitaxially deposited on a substrate by placing the substrate and a charge of the semiconductor material and a solvent therefore in separate portions of a container. The container and its contents are heated to a temperature at which the charge becomes a solution of molten solvent having the semiconductor material dissolved therein. The solution is then brought into contact with a surface of the substrate and the container and its contents are cooled to precipitate out some of the semiconductor material from the solution and deposit the semiconductor material on the substrate. During the cooling of the container and its contents heat is radiated from the substrate faster than from the solution so that the substrate is at a temperature slightly below the temperature of the solution. The faster heat radiation from the substrate is achieved by providing the container with a heat radiation window therethrough and seating the substrate over the window.

DETAILED DESCRIPTION

Figure 1:
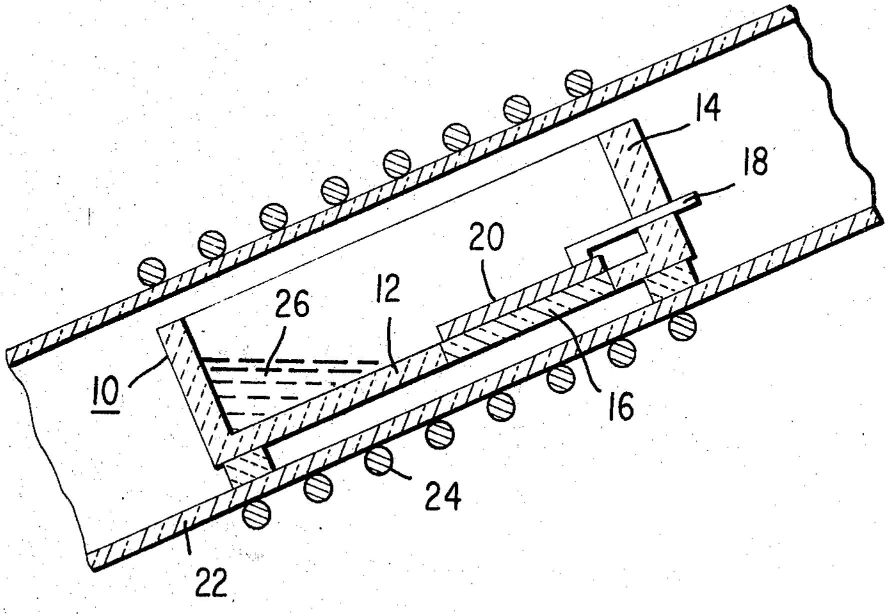
FIG. 1 is a sectional view of one form of the apparatus of the present invention which is capable of carrying out the method of the present invention.

Referring initially to FIG. 1, one form of the apparatus of the present invention comprises a boat type container 10 having a bottom 12 and upright walls 14. The boat 10 is generally rectangular and is made of a refractory material, such as graphite. The bottom 12 of the boat 10 has a heat radiation window 16 therein adjacent one end of the boat. The window 16 may be an opening through the bottom 12 of the boat 10. However, as shown, it is preferable that the window 16 be a body of a material which is transparent to heat radiation characteristic for the temperatures used in the method of the present invention, such as sapphire or quartz. The use of a heat radiation transparent body for the window 16 is preferred in order to provide a suitable support for a substrate on which the semiconductor material is to be deposited. The boat 10 is provided with a clamp, diagrammatically indicated at 18, to hold a substrate to the boat.

In the use of the boat 10 to carry out the method of the present invention, a substrate 20 of a material suitable for eiptaxial deposition is placed on the window 16 in the bottom 12 of the boat and is firmly held thereon by the clamp 18. Thus, the substrate 20 is secured in the boat 10 at one end of the boat. A charge is placed in the boat 10 at the other end of the boat. The charge is a mixture of the semiconductor material of the epitaxial layer to be deposited, a metal solvent for the semiconductor material and, if the epitaxial layer is to be a particular conductivity type, a conductivity modifier. For example, to deposit an epitaxial layer of gallium arsenide, the semiconductor material would be gallium arsenide, the metal solvent could be galluim, and the conductivity modifier could be either tellurium or tin for an N type layer, or zinc, germanium or magnesium for a P type layer.

As shown in FIG. 1, the loaded boat 10 is then placed in a furnace tube 22, which may be of quartz, having a suitable heating means, such as a resistance heater 24. The furnace tube 22 is tilted, as shown in FIG. 1, so that the end of the boat 10 in which the charge is located is lowermost. A flow of high purity hydrogen is provided through the furnace tube and over the boat 10. The heater 24 is turned on to heat the contents of the boat 10 to a temperature at which the solvent in the charge is molten and the semiconductor material and conductivity modifier dissolves in the solvent, for example between 800°C and 950°C for gallium arsenide.

Thus, the charge becomes a solution 26 of the semiconductor material and the conductivity modifier in the molten solvent. The solution 26 is maintained at this temperature long enough to insure complete homogenization of the ingredients.

The furnace tube 22 is then tilted in the opposite direction so that the end of the boat 10 in which the substrate 20 is located is lowermost. This causes the solution 26 to flow over and flood the substrate 20 so that the upper surface of the substrate is in contact with the solution. The temperature of the furnace tube 22 is then reduced to cool the boat 10 and its contents. Cooling of the solution 26 causes some of the semiconductor material in the solution to precipitate out and deposit on the surface of the substrate 20 to form an epitaxial layer of the semiconductor material. Some of the conductivity modifier in the solution 26 becomes incorporated in the lattice of the epitaxial layer to provide an epitaxial layer of a desired conductivity type. The cooling of the substrate 20 results from heat radiating from the substrate through the window 16, which is transparent to heat radiation characteristic for the then temperature of the substrate, into the ambient in the furnace tube 22, whereas cooling of the solution 26 results from heat radiating from the solution into the furnace tube ambient through the surface of the solution. It has been found that the heat will radiate faster from the substrate 20 through the window 16 than from the solution 26. One reason for this is that the solution 26, which is metallic, has a heat deflecting surface which slows down the rate of heat radiation from the solution. Also, the solution 26 is generally thicker than the thickness of the substrate 20. Thus, although the substrate 20 and the solution 26 are both radiating heat into the same ambient, the combination of the thinner substrate and the faster heat radiation from the substrate will cause the portion of the substrate 20 at the interface with the solution 26 to be at a temperature slightly below the temperature of the portion of the solution at the interface. Thus, dendritic growth of the semiconductor material is prevented so that an epitaxial layer of good planarity is deposited on the substrate.

After an epitaxial layer of the desired thickness is deposited on the substrate 20, the furnace tube 22 is tilted back to its original position as shown in FIG. 1. This decants the remaining solution from the substrate 20. Additional layers can be epitaxially deposited on the first layer by repeating the above-described method using fresh solution.

Figure 2:
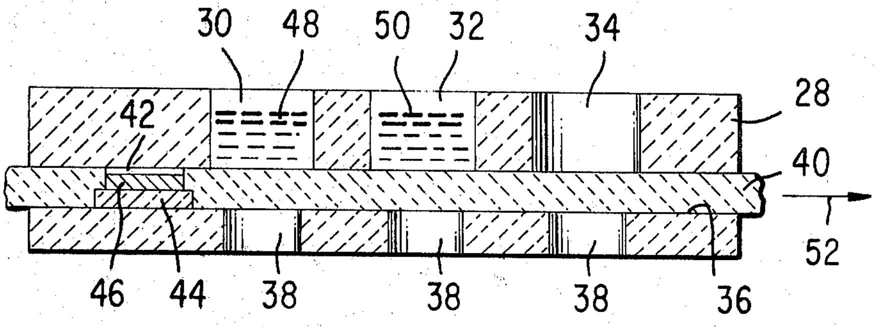
FIG. 2 is a sectional view of another form of the apparatus of the present invention.

Referring to FIG. 2, there is shown another form of the apparatus of the present invention which comprises a boat 28 of a refractory material, such as graphite. The boat 28 has three spaced wells 30, 32 and 34 in its upper surface. A passage 36 extends longitudinally through the boat 28 from one end to the other and extends across the bottoms of the wells 30, 32 and 34. Holes 38 extend through the boat 28 from the bottom surface of the boat to the passage 36 with the holes being located beneath the wells 30, 32 and 34. A slide 40 of a refractory material, such as graphite, movably extends through the passage 36 so that the top surface of the slide forms the bottom surfaces of the wells 30, 32 and 34. The slide 40 has a recess 42 in its top surface adjacent one end thereof and a heat radiation window 44 therethrough at the bottom of the recess 42. Although the window 44 may be an opening through the bottom of the recess 42, it is preferably a body of a material which is transparent to heat radiation, such as sapphire or quartz.

In the use of the boat 28 to carry out the method of the present invention, a substrate 46 of a material suitable for epitaxial deposition is placed in the recess 42 over the window 44. A first charge is placed in the well 30 and a second charge is placed in the well 32. Each of the charges is a mixture of a semiconductor material to be deposited, a metal solvent for the semiconductor material and, if the epitaxial layer is to be a particular conductivity type, a conductivity modifier. The loaded boat 28 is placed in a furnace tube, such as the furnace tube 22 shown in FIG. 1 but which is maintained in a substantially horizontal position. A flow of high purity hydrogen is provided through the furnace tube and over the boat 28. The heating means for the furnace tube is turned on to heat the contents of the boat 28 to a temperature at which the solvent is molten and the semiconductor material and conductivity modifier will dissolve in the solvent. The first and second charges then become first and second solutions 48 and 50 respectively of the semiconductor material and conductivity modifier in the molten solvent.

The slide 40 is then moved in the direction of the arrow 52 in FIG. 2 until the substrate 46 is within the well 30 and the window 44 is over a hole 38. This brings the surface of the substrate 46 into contact with the first solution 48. The temperature of the furnace tube is then lowered to cool the boat 28 and its contents. Cooling of the first solution 48 causes some of the semiconductor material in the first solution to precipitate out and deposit on the surface of the substrate 46 to form a first epitaxial layer. During the deposition of the semi-conductor material some of the conductivity modifier in the first solution 48 becomes incorporated in the lattice of the semiconductor material so as to provide the first epitaxial layer with a desired conductivity type.

The slide 40 is then moved again in the direction of the arrow 52 until the substrate 46 with the first epitaxial layer thereon is within the well 32 and the window 44 is over a hole 38. This brings the surface of the first epitaxial layer into contact with the second solution 50. The temperature of the furnace tube is then lowered further to further cool the boat 28 and its contents. This cooling of the second solution 50 causes some of the semiconductor material in the second solution to precipitate out and deposit on the first epitaxial layer to form a second epitaxial layer. During the deposition of the second epitaxial layer, some of the conductivity modifier in the second solution becomes incorporated in the lattice of the deposited semiconductor material so as to provide the second epitaxial layer with a desired conductivity type. The slide 40 is then again moved in the direction of the arrow 52 until the substrate 46 with the two epitaxial layers thereon is within the empty well 34 where the substrate can be removed from the slide 40.

When the temperature of the furnace tube is reduced to deposit the epitaxial layers, the substrate 46 and the solutions 48 and 50 are cooled by heat radiating therefrom into the ambient within the furnace tube. The substrate 46 is cooled by the heat radiating therefrom through the window 44 and one of the holes 38 in the boat 28. As was previously described with regard to the boat 10 shown in FIG. 1, it has been found that the window 44 allows heat to radiate from the substrate 46 faster than the heat radiates from the solutions. Thus, during the deposition of the semiconductor material the portion of the substrate or the first epitaxial layer which is at the interface with the solution is at a temperature slightly lower than that of the solution so that dendritic growth of the semiconductor material is prevented. This provides for the growth of epitaxial layers having good planarity.

Although the boat 28 has been described as being used to deposit two epitaxial layers on a substrate in succession, it can be used to deposit either a single epitaxial layer or more than two epitaxial layers. To deposit a single epitaxial layer a deposition solution is provided in only one of the wells. To deposit more than two epitaxial layers, the boat is provided with enough wells to form a separate solution for each epitaxial layer to be deposited. The slide is moved to carry the substrate into each of the wells in succession and while the substrate is in each well the boat and its contents are cooled to deposit an epitaxial layer.

Thus, there is provided by the present invention a method and apparatus for depositing one or more epitaxial layers of a semiconductor material on a substrate by liquid phase epitaxy wherein during the deposition of each epitaxial layer the substrate is at a temperature slightly below the temperature of the solution so as to achieve epitaxial layers of good planarity. This temperature difference is achieved by mounting the substrate over a heat radiation window so that when the ambient around the deposition solution and the substrate is cooled to achieve deposition of the semiconductor material, heat is radiated from the substrate faster than from the deposition solution.

I claim:

1. In a method of epitaxially depositing a semiconductor material on a substrate wherein the substrate and a charge of the semiconductor material and a solvent therefore are placed in separate portions of a container, the container and its contents are heated to a temperature at which the charge becomes a solution of the semiconductor material dissolved in said solvent which is molten, bringing the solution into contact with a surface of the substrate and then cooling the container and its contents to precipitate out some of the semiconductor material from the solution which deposits on the substrate, the improvement comprising during the cooling of the container and its contents, cooling both the substrate and the solution by radiating heat therefrom into the ambient around the container and radiating heat from the substrate faster than from the solution by exposing a surface of the substrate to the ambient around the container through a heat transparent window in the container so that the substrate is at a temperature slightly below the temperature of the solution.

* * * * *